United States Patent [19]
Reinberg et al.

[11] Patent Number: 6,087,270
[45] Date of Patent: Jul. 11, 2000

[54] METHOD OF PATTERNING SUBSTRATES

[75] Inventors: Alan R. Reinberg; Kevin G. Donohoe, both of Boise; Brian A. Vaartstra, Nampa, all of Id.

[73] Assignee: Micron Technology, Inc., Boise, Id.

[21] Appl. No.: 09/100,528

[22] Filed: Jun. 18, 1998

[51] Int. Cl.[7] ........................ H01L 21/302; H01L 21/461
[52] U.S. Cl. .......................... 438/736; 438/743; 438/717; 438/950; 216/49
[58] Field of Search ..................................... 438/736, 743, 438/738, 717, 945, 950, 99; 216/49, 47

[56] References Cited

U.S. PATENT DOCUMENTS

| | | | |
|---|---|---|---|
| 4,244,799 | 1/1981 | Fraser et al. ............................... | 204/192 |
| 4,692,205 | 9/1987 | Sachdev et al. ........................ | 156/634 |
| 5,906,912 | 5/1999 | Watanabe et al. ....................... | 430/317 |
| 5,910,453 | 6/1999 | Gupta et al. ............................. | 438/717 |

FOREIGN PATENT DOCUMENTS

| | | |
|---|---|---|
| 11119441 | 4/1999 | Japan . |

OTHER PUBLICATIONS

Keiji Watanabe; Journal of Photopolymer Science and Technology; vol. 9, #4; p. 697–706, 1996.

Keiji Watanabe; Proc. SPIE–Int. Soc. Opt. Eng.; vol. 3333; p. 768–775, 1998.

Graham, Teresita, et al., "Conducting Polyaniline Coatings For Submicron Lithography And SEM Metrology", *SPIE*. vol. 3049, pp. 105–113 (undated).

Van Zant, Peter, *Microchip Fabrication, A practical Guide To Semiconductor Processing*, 2nd Edition, McGraw–Hill, Inc., pp. 247–249 (1990).

Einspruch, Norman G., *VLSI Electronics Microstructure Science, vol. 8—Plasma Processing for VLSI*, "Chapter 5, Trilayer Resist", pp. 91–136 (Academic Press, Inc. 1984).

Wolf, Stanley, Ph.D. et al., *Silicon Processing For The VLSI Era*, "Vol. 1—Process Technology", Lattice Press, Sunset Beach, CA pp. 423–424 (1986).

*Primary Examiner*—William Krynski
*Assistant Examiner*—B. Shewareged
*Attorney, Agent, or Firm*—Wells, St. John, Roberts, Gregory & Matkin P.S.

[57] ABSTRACT

The invention includes methods of patterning substrates. In one implementation, an electrically conductive etch mask layer is formed over a substrate. A resist layer, for example photoresist, is formed over the etch mask layer. The etch mask layer is etched into through an opening formed in the patterned resist. The etching preferably comprises dry etching within a dual source, high density plasma etcher using an oxygen containing gas. Substrate layers beneath the electrically conductive base layer are preferably etched through one or more openings formed in the conductive layer at least in part by the preferred dry etching. The etch mask layer and resist are ultimately removed from the substrate.

135 Claims, 4 Drawing Sheets

METHOD OF PATTERNING SUBSTRATES

TECHNICAL FIELD

This invention relates to methods of patterning substrates, particularly in semiconductor wafer fabrication.

BACKGROUND OF THE INVENTION

The desire for integrated circuits of greater complexity and performance has driven designers to shrink the size of minimum features in the horizontal plane. Avoidance of excessive current density, however, has meant that the horizontal scaling has not necessarily been accompanied by a reduction in the vertical dimension. This has resulted in increase of the ratio of feature height to feature width, something generally referred to as aspect ratio. The increased aspect ratio has resulted in problems with the use of conventional single-layer resists in integrated circuitry fabrication. Multilevel resist processes have been developed to overcome these problems.

Multilevel resist processing is a lithography method (not necessarily photolithography) whereby a thick base layer (not necessarily a resist sensitive layer) is covered with one or more thinner layers, the top one of which is a sensitive film at the wavelength of light or other exposure energy to be used. The thick base layer is typically an organic layer which is spun onto the wafer and may be thicker than the underlying steps to provide an outer surface which is smooth and generally planar. If the underlaying layer over which the base layer is provided is not already planar, the base layer is typically intended to provide a significantly more planar outer surface than the original wafer topography. An example thickness for the base layer is 1 micron.

After baking this bottom layer, a thinner imaging layer is provided thereover. In certain instances, a thin intermediate masking layer, such as $SiO_2$, is deposited on the thick layer prior to depositing the imaging layer. High resolution patterns are then created in the thin top layer through openings in a mask utilizing incident energy capable of changing properties of the exposed portions of the outer layer. The transformed regions of the thin top layer are then removed. The removed portions are next precisely transferred into the underlying layers, including the thick planarizing layer, using the delineated imaging layer as a blanket exposure or etching mask to pattern the base or planarizing layer. Example preferred prior art methods include reactive ion etching utilizing an oxygen-containing gas in a high density plasma etcher for the base layer. For the intermediate masking layer, an example etching chemistry is a fluorocarbon/hydrofluorocarbon gas mix.

Multilevel resist technology has not gained significant popularity due to the added complexity and cost compared to standard lithography/resist combinations using a single layer of resist. Yet there are at least two reasons that may make the use of multilevel resist technologies for patterning substrates more desirable in the future.

First, shorter and shorter wavelengths when the resist layer is photoresist are being utilized to achieve better resolution. Unavailability of appropriate single layer resists for the wavelength of interest may prevent use of single layer resist. For example, production wavelengths below 200 nanometer may fundamentally require use of multilevel resist technology. Second, multilayer resist technology may be utilized to extend the useful life of current lithography tools by decreasing the imaging layer thickness. This would be highly desirable to avoid or delay incurring the very high cost of purchasing new lithography technology and equipment.

However, the use of multilevel resist technology to define very small feature sizes (i.e., less than or equal to 2000 Angstroms) has proven to be difficult as the reactive ion etching processes currently in use produce two undesirable and competing side effects. For example, consider the problem with respect to the prior art constructions depicted by FIGS. 1 and 2. FIG. 1 illustrates a semiconductor wafer fragment 10 comprising a bulk monocrystalline silicon substrate 12 having exemplary conductive features in the form of lines 14 patterned thereover. A planarizing layer 16 of insulating dielectric material is provided over substrate 12 and lines 14. The goal or intent in this example is to etch a contact opening to each of lines 14. A thick base layer 18 (i.e., 10,000 Angstroms thick) of insulative organic polymer is provided over layer 16. An intermediate hard mask layer 20, for example $SiO_2$, is provided over layer 18, and a top layer 22 of desired energy sensitive material is provided over layer 20. Layer 22 is illustrated as having been exposed through a mask and subsequently developed to form openings 24 therethrough to layer 20.

Referring to FIG. 2, the substrate is next etched (for example using a fluorocarbon/hydrofluorocarbon gas mix) to extend openings 24 through layer 20. Then, the substrate is reactive ion etched (typically utilizing some gas containing oxygen) to etch through layer 18. Example reactive ion etching gases include $O_2$, $O_2$ and $N_2$, $CO_2$ and $N_2O$. The reactive ion etching with the oxygen species has the effect of transferring the opening patterning through hard mask layer 20, and etches downwardly through base layer 18. It also completely etches away the overlying masking layer 22. FIG. 2 illustrates two competing adverse effects which can occur with such etching. First, unfortunately the high energy which is desired to achieve a suitable etch rate in the reactive ion etching can have a tendency to facet etch silicon dioxide layer 20, as evidenced by the outwardly flaring nature of the formed openings within layer 20. This can result in eventually widening the subject openings to the point where adverse effects are achieved in the desired pattern.

One prior art technique for reducing this problem is to lower the energy in the reactive ion etching. Yet, energy lowering reduces etch rate. Also unfortunately, the energy lowering has a tendency to result in poor profile control caused by distortion of the lower energy ions as they travel through the feature towards its bottom. Specifically, the negatively charged electrons tend to charge the upper portion of the feature with a negative charge. This causes the lower energy positive ions to be deflected. This deflection reduces the anisotropy of the etch, leading to distortion of the etch profile from the desired vertical shapes. The distortion results from the charge buildup on the insulating sidewall of the etching feature in layer 18.

It would be desirable to overcome these problems associated with multilayer resist and other processing in fabricating semiconductor wafers.

SUMMARY OF THE INVENTION

The invention includes methods of patterning substrates. In one implementation, an electrically conductive etch mask layer is formed over a substrate. A resist layer, for example photoresist, is formed over the etch mask layer. The etch mask layer is etched into through an opening formed in the patterned resist. The etching preferably comprises dry etching within a dual source, high density plasma etcher using an oxygen containing gas. Substrate layers beneath the electrically conductive base layer are preferably etched through one or more openings formed in the conductive layer at least in part by the preferred dry etching. The etch mask layer and resist are ultimately removed from the substrate.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
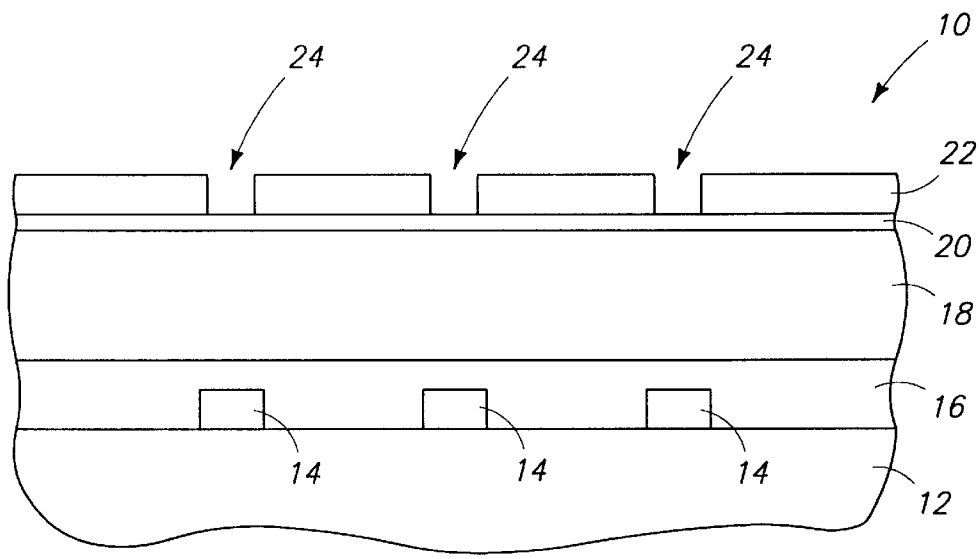
FIG. 1 is a diagrammatic sectional view of a prior art wafer fragment at one prior art processing step, and is discussed above in the "Background" section.
Figure 2:
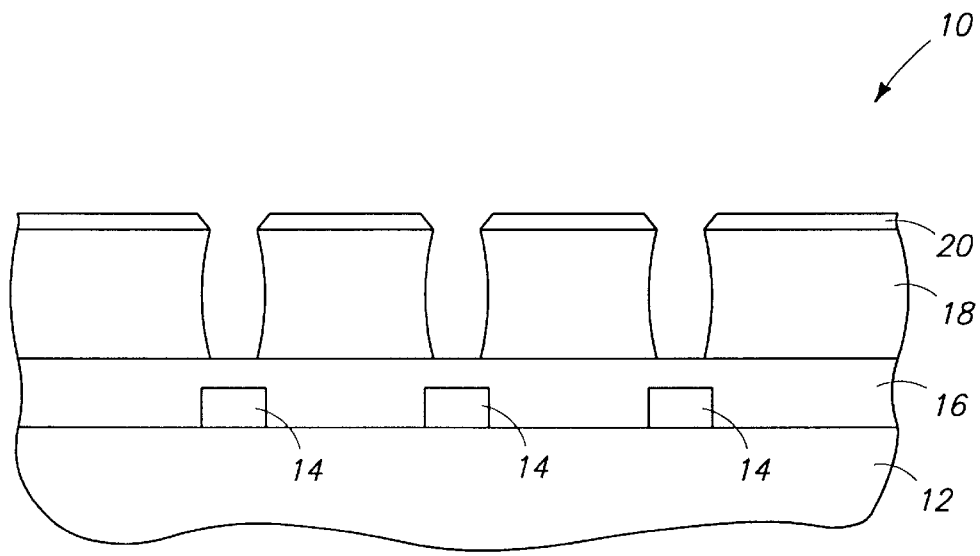
FIG. 2 is a view of the FIG. 1 wafer fragment at a prior art processing step subsequent to that shown by FIG. 1.
Figure 3:
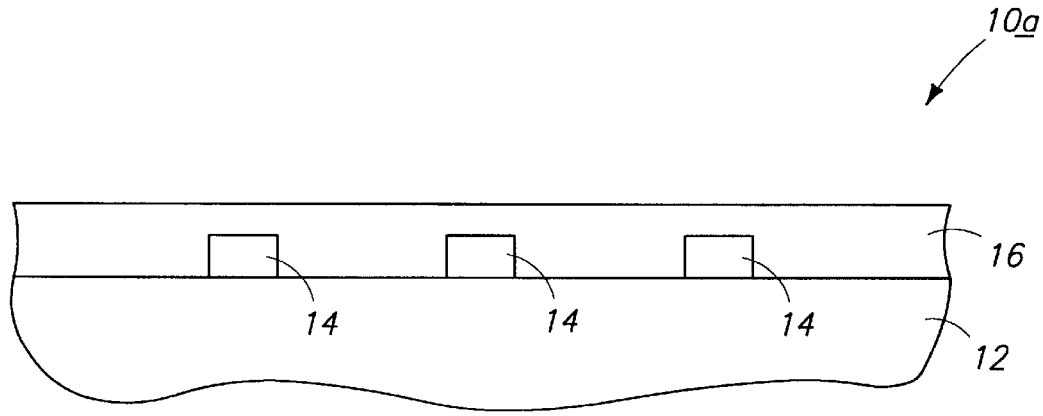
FIG. 3 is a diagrammatic sectional view semiconductor wafer fragment at one processing step in accordance with the invention.

Preferred aspects of the invention are described with reference to FIGS. 3–7. Like numerals from the prior art described embodiment have been utilized where appropriate, with differences being indicated with different numerals or by the suffix "a". FIG. 3 illustrates a semiconductor wafer fragment 10a comprising a bulk monocrystalline silicon substrate 12 having conductive features 14 formed thereover. An insulating dielectric layer 16 is provided over features 14, and in this example is provided with a substantially planar outer surface.

Figure 4:
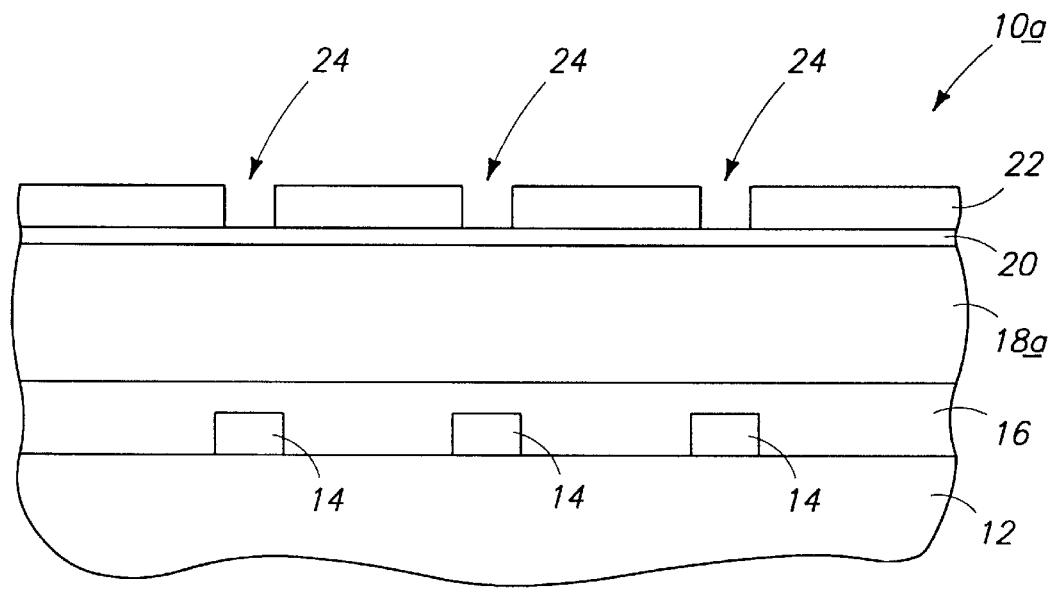
FIG. 4 is a view of the FIG. 3 wafer at a processing step subsequent to that shown by FIG. 3.

Referring to FIG. 4, an electrically conductive etch mask layer 18a is formed over layer 16 to a first thickness. The thickness of layer 18a is preferably substantially the same as the thickness of layer 18 in the prior art described embodiment. If layer 16 is provided to not have a planar outer surface, base etch mask layer 18a would preferably be provided to have greater outer surface planarity than planarity of the immediately underlying surface over which base etch mask layer 18a was formed. Conductive layer 18a preferably comprises a polymer, such as inherently conducting organic polymers. By way of example only, specific preferred materials include polyaniline, polypyrrole, polyacetylene, polyphenylene, polyphenylenevinylene, polythiophene, copolymers of N-substituted pyrroles and thiophene, polyquinolines, polycarbazoles, polyphenothiozones, polyphthalocyanines and polyphenylsulfide. By way of example only, further possibilities for layer 18a include polymer matrixes having conductive material dispersed therein. Examples include tetrathiafulvalene and tetracyanoquinodimethane in polycarbonate; carbon, silver, aluminum and/or other metals dispersed in the form of fibers, needles, flakes, coagulates, or particles in thermoplastics or thermosets; polymers doped with transition metal halides (e.g., $TiCl_4$), or non-transition metal halides (such as $SnCl_4$ or $AsF_5$); and organic-inorganic hybrids, such as those formed from alkoxysilanes or metal alkoxides having a polymerizable alkyl group. Further by way of example only, conductive metalorganic or organo-metallic polymers might be utilized. Examples include polymetallophthalocyanines; polymetalynes such as poly(phenylethynyl copper) possibly also doped with halide; polymeric metal complexes of tetrathiolatopyrazine; and polymeric metal complexes of tetrathiolatobisdithiinopyrazine. All of the above materials can be deposited by spin-on, dip coating, nebulizing and physical or chemical vapor deposition techniques.

An intermediate masking layer 20 is formed over layer 18a, followed by formation and patterning of a resist layer 22 over intermediate layer 20. An example thickness for layer 20 is from 500 Angstroms to 2000 Angstroms. Layer 22 is fabricated of a material designed to be sensitive to the incident radiation of interest for appropriate patterning and developing, with photoresist being but one example material. Layer 22 is formed to a second thickness which is less than the thickness of layer 18a, with from 1000 Angstroms to 2000 Angstroms being an example. Openings 24 are formed in resist layer 22. The invention is expected to have its greatest impact where at least one of openings 24 has a minimum open dimension of less than or equal to 0.2 micron.

Figure 5:
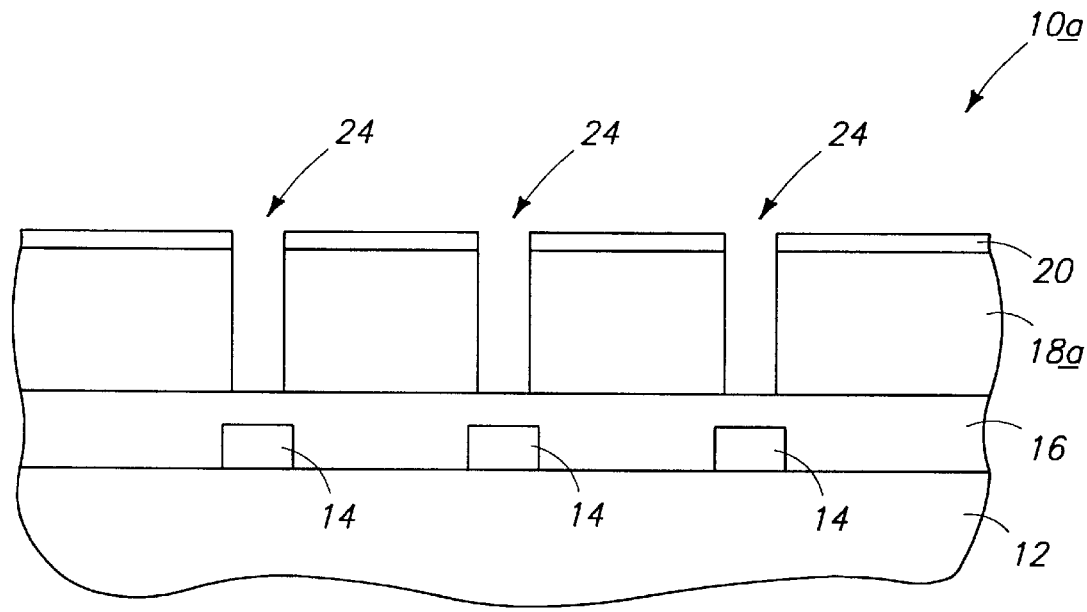
FIG. 5 is a view of the FIG. 3 wafer at a processing step subsequent to that shown by FIG. 4.

Referring to FIG. 5, etching is conducted through intermediate hard mask layer 20 and ultimately into conductive etch mask layer 18a through openings 24 formed in resist layer 22. As shown, such etching is preferably conducted to etch openings 24 completely through layers 20 and 18a, and preferably selectively relative to interlevel dielectric layer 16. The initial etching through layer 20, where such comprises $SiO_2$, can be conducted using a fluorocarbon/hydrofluorocarbon gas mix. utilizes one or more oxygen containing gases, such as those described above. In the preferred and believed most applicable aspects of the invention, openings 24 transferred into layer 18a will also have a respective minimum open dimension of less than or equal to 0.2 micron. The reactive ion etching preferably results in an ion energy of less than or equal to about 50 volts, and is conducted at a pressure or less than or equal to about 10 mTorr. The conductive nature of layer 18a can facilitate the prevention of charge buildup on the inside of the surface of the forming contact openings 24 within layer 18a, thus allowing the etching ions to recombine with negative charge buildup on the surface upper portions of the etching features in the etching direction desired. This enables low energy ions to be used at a high current, and to increase the etch rate without undesirable bending of the ions inside the feature due to charge buildup. Accordingly, anisotropy in the etch can be increased while achieving reduced faceting of layer 20 in combination with acceptable etch rates.

Figure 6:
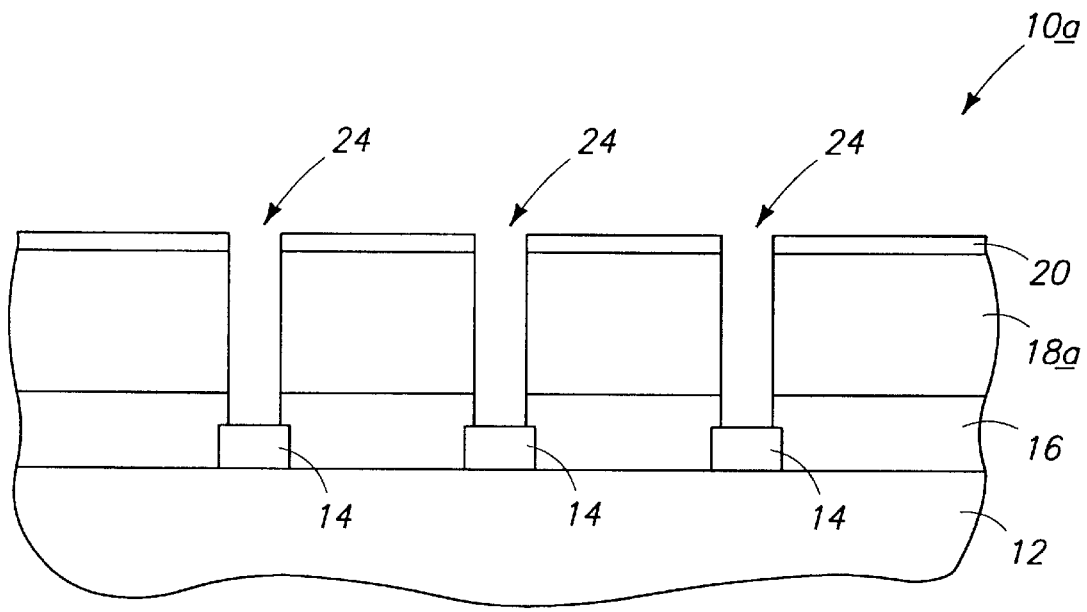
FIG. 6 is a view of the FIG. 3 wafer at a processing step subsequent to that shown by FIG. 5.
Figure 7:
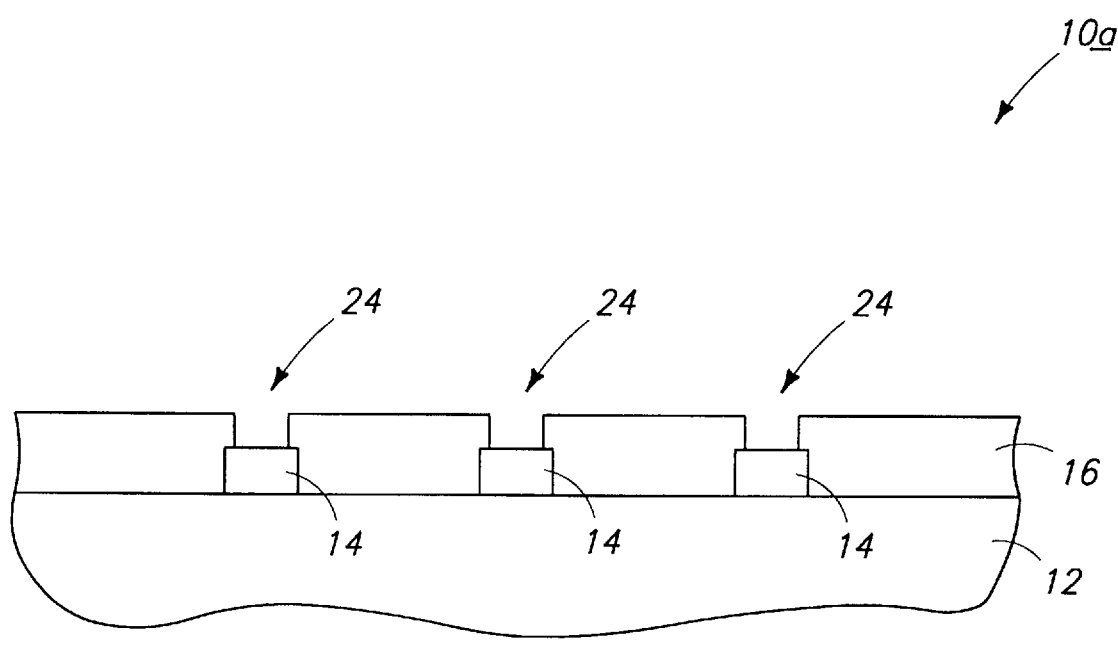
FIG. 7 is a view of the FIG. 3 wafer at a processing step subsequent to that shown by FIG. 6.

Referring to FIG. 6, substrate layer 16 beneath electrically conductive layer 18a is etched through openings 24 formed in layer 18, preferably at least in part by essentially continuing the preferred dry etching described above. Referring to FIG. 7, electrically conductive layer 18a and hard mask layer 20 are removed from the substrate. Resist layer 22 of course has been previously removed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of patterning a substrate comprising:

forming an electrically conductive etch mask layer over a substrate;

forming and patterning a resist layer over the etch mask layer;

etching into the etch mask layer through an opening formed in the patterned resist;

removing the etch mask layer and resist from the substrate; and the electrically conductive etch mask layer comprising an organic polymer selected from the group consisting of polypyrrole, polyacetylene, polyphenylene, polyphenylenevinylene, polythiophene, copolymers of N-substituted pyrroles and thiophene, polyquinolines, polycarbazoles, polyphenothiozones, polyphthalocyanines, polyphenylsulfide, and mixtures thereof.

2. A method of patterning a substrate comprising:

forming an electrically conductive etch mask layer over a substrate;

forming and patterning a resist layer over the etch mask layer;

etching into the etch mask layer through an opening formed in the patterned resist;

removing the etch mask layer and resist from the substrate; and the electrically conductive etch mask layer comprising an organic polymer selected from the group consisting of polymetallophthalocyanines, polymetalynes, polymeric metal complexes of tetrathiolatopyrazine, polymeric metal complexes of tetrathiolatobisdithiinopyrazine, and mixtures thereof.

3. A method of patterning a substrate comprising:

forming an electrically conductive etch mask layer over a substrate;

forming and patterning a resist layer over the etch mask layer;

etching into the etch mask layer through an opening formed in the patterned resist;

removing the etch mask layer and resist from the substrate; and wherein the electrically conductive etch mask layer comprises an electrically insulative polymer which has a conductivity enhancing material added therein effective to render the etch mask layer electrically conductive.

4. A method of patterning a substrate comprising:

forming an electrically conductive etch mask layer over a substrate;

forming and patterning a resist layer over the etch mask layer;

etching into the etch mask layer through an opening formed in the patterned resist;

removing the etch mask layer and resist from the substrate; and wherein the electrically conductive etch mask layer comprises a polymer which has a conductivity enhancing material added therein, the conductivity enhancing material being selected from the group consisting of tetrathiafulvalene, tetracyanoquinodimethane, carbon, silver, aluminum, transition metal halides, non-transition metal halides, and mixtures thereof.

5. A method of patterning a substrate comprising:

forming an electrically conductive etch mask layer over a substrate;

forming and patterning a resist layer over the etch mask layer;

etching into the etch mask layer through an opening formed in the patterned resist;

removing the etch mask layer and resist from the substrate; and further comprising providing a masking layer intermediate the etch mask layer and the resist layer.

6. A multilevel resist processing method comprising:

forming a base etch mask layer of electrically conductive material;

forming and patterning a layer of resist over the conductive etch mask layer;

reactive ion etching into the conductive etch mask layer through an opening in the resist layer using an oxygen containing gas, high density plasma and a pressure at or below 10 mTorr; and wherein the base etch mask layer has greater outer surface planarity than planarity of an immediately underlying surface over which the base etch mask layer is formed.

7. The method of claim 6 comprising forming the opening in the patterned resist layer to have a minimum open dimension of less than or equal to 0.2 micron, the reactive ion etching forming an opening through the conductive layer having a minimum open dimension of less than or equal to 0.2 micron.

8. A multilevel resist processing method comprising:

forming a base etch mask layer of electrically conductive material;

forming and patterning a layer of resist over the conductive etch mask layer;

reactive ion etching into the conductive etch mask layer through an opening in the resist layer using an oxygen containing gas, high density plasma and a pressure at or below 10 mTorr; and the electrically conductive etch mask layer comprising an organic polymer selected from the group consisting of polypyrrole, polyacetylene, polyphenylene, polyphenylenevinylene, polythiophene, copolymers of N-substituted pyrroles and thiophene, polyquinolines, polycarbazoles, polyphenothiozones, polyphthalocyanines, polyphenylsulfide, and mixtures thereof.

9. A multilevel resist processing method comprising:

forming a base etch mask layer of electrically conductive material;

forming and patterning a layer of resist over the conductive etch mask layer;

reactive ion etching into the conductive etch mask layer through an opening in the resist layer using an oxygen containing gas, high density plasma and a pressure at or below 10 mTorr; and the electrically conductive etch mask layer comprising an organic polymer selected from the group consisting of polymetallophthalocyanines, polymetalynes, polymeric metal complexes of tetrathiolatopyrazine, polymeric metal complexes of tetrathiolatobisdithiinopyrazine, and mixtures thereof.

10. A multilevel resist processing method comprising:

forming a base etch mask layer of electrically conductive material;

forming and patterning a layer of resist over the conductive etch mask layer;

reactive ion etching into the conductive etch mask layer through an opening in the resist layer using an oxygen containing gas, high density plasma and a pressure at or below 10 mTorr; and wherein the electrically conductive base layer comprises an electrically insulative polymer which has a conductivity enhancing material added therein effective to render the etch mask layer electrically conductive.

11. A multilevel resist processing method comprising:

forming a base etch mask layer of electrically conductive material;

forming and patterning a layer of resist over the conductive etch mask layer;

reactive ion etching into the conductive etch mask layer through an opening in the resist layer using an oxygen containing gas, high density plasma and a pressure at or below 10 mTorr; and wherein the electrically conductive base layer comprises a polymer which has a conductivity enhancing material added therein, the conductivity enhancing material being selected from the group consisting of tetrathiafulvalene, tetracyanoquinodimethane, carbon, silver, aluminum, transition metal halides, non-transition metal halides, and mixtures thereof.

12. A multilevel resist processing method comprising:

forming a base etch mask layer of electrically conductive material;

forming and patterning a layer of resist over the conductive etch mask layer;

reactive ion etching into the conductive etch mask layer through an opening in the resist layer using an oxygen containing gas, high density plasma and a pressure at or below 10 mTorr; and further comprising providing a masking layer intermediate the etch mask layer and the resist layer.

13. A method of patterning a substrate comprising:

depositing an electrically conductive layer over a substrate;

forming and patterning a resist layer over the electrically conductive layer;

providing the substrate with patterned resist layer within a high density plasma etcher;

dry etching within the high density plasma reactor into the electrically conductive layer through an opening formed in the patterned resist;

etching into a substrate layer beneath the electrically conductive layer through an opening formed in the conductive layer at least in part by the dry etching;

removing the electrically conductive layer and the resist layer from the substrate; and the electrically conductive etch mask layer comprising an organic polymer selected from the group consisting of polypyrrole, polyacetylene, polyphenylene, polyphenylenevinylene, polythiophene, copolymers of N-substituted pyrroles and thiophene, polyquinolines, polycarbazoles, polyphenothiozones, polyphthalocyanines, polyphenylsulfide, and mixtures thereof.

14. A method of patterning a substrate comprising:

depositing an electrically conductive layer over a substrate;

forming and patterning a resist layer over the electrically conductive layer;

providing the substrate with patterned resist layer within a high density plasma etcher;

dry etching within the high density plasma reactor into the electrically conductive layer through an opening formed in the patterned resist;

etching into a substrate layer beneath the electrically conductive layer through an opening formed in the conductive layer at least in part by the dry etching;

removing the electrically conductive layer and the resist layer from the substrate; and the electrically conductive etch mask layer comprising an organic polymer selected from the group consisting of polymetallophthalocyanines, polymetalynes, polymeric metal complexes of tetrathiolatopyrazine, polymeric metal complexes of tetrathiolatobisdithiinopyrazine, and mixtures thereof.

15. A method of patterning a substrate comprising:

depositing an electrically conductive layer over a substrate;

forming and patterning a resist layer over the electrically conductive layer;

providing the substrate with patterned resist layer within a high density plasma etcher;

dry etching within the high density plasma reactor into the electrically conductive layer through an opening formed in the patterned resist;

etching into a substrate layer beneath the electrically conductive layer through an opening formed in the conductive layer at least in part by the dry etching;

removing the electrically conductive layer and the resist layer from the substrate; and wherein the electrically conductive layer comprises an electrically insulative polymer which has a conductivity enhancing material added therein effective to render the etch mask layer electrically conductive.

16. A method of patterning a substrate comprising:

depositing an electrically conductive layer over a substrate;

forming and patterning a resist layer over the electrically conductive layer;

providing the substrate with patterned resist layer within a high density plasma etcher;

dry etching within the high density plasma reactor into the electrically conductive layer through an opening formed in the patterned resist;

etching into a substrate layer beneath the electrically conductive layer through an opening formed in the conductive layer at least in part by the dry etching;

removing the electrically conductive layer and the resist layer from the substrate; and wherein the electrically conductive layer comprises a polymer which has a conductivity enhancing material added therein, the conductivity enhancing material being selected from the group consisting of tetrathiafulvalene, tetracyanoquinodimethane, carbon, silver, aluminum, transition metal halides, non-transition metal halides, and mixtures thereof.

17. A method of patterning a substrate comprising:

depositing an electrically conductive layer over a substrate;

forming and patterning a resist layer over the electrically conductive layer;

providing the substrate with patterned resist layer within a high density plasma etcher;

dry etching within the high density plasma reactor into the electrically conductive layer through an opening formed in the patterned resist;

etching into a substrate layer beneath the electrically conductive layer through an opening formed in the conductive layer at least in part by the dry etching;

removing the electrically conductive layer and the resist layer from the substrate; and further comprising providing a masking layer intermediate the conductive layer and the resist layer.

18. A method of patterning a substrate comprising:

depositing an electrically conductive etch mask polymer layer over a previously patterned substrate to a first thickness;

forming and patterning a resist layer over the conductive etch mask layer to a second thickness which is less than the first thickness, the patterning forming an opening in the resist layer having a minimum open dimension of less than or equal to 0.2 micron;

providing the substrate with patterned resist layer within a dual powered high density plasma etcher;

reactive ion etching within the plasma reactor through the electrically conductive layer through the resist opening using an oxygen containing plasma, the etching being conducted using ion energy of greater than 0 Volts and less than or equal to about 50 Volts and at a pressure of less than or equal to about 10 mTorr, and producing an opening in the conductive etch mask layer having a minimum open dimension of less than or equal to 0.2 micron;

etching into a substrate layer beneath the conductive etch mask layer through the conductive polymer layer opening to form a substrate feature having a minimum width of less than or equal to 0.2 micron;

removing the electrically conductive layer and the resist layer from the substrate; and the electrically conductive layer comprises an organic polymer selected from the group consisting of polypyrrole, polyacetylene, polyphenylene, polyphenylenevinylene, polythiophene, copolymers of N-substituted pyrroles and thiophene, polyquinolines, polycarbazoles, polyphenothiozones, polyphthalocyanines, polyphenylsulfide, and mixtures thereof.

19. A method of patterning a substrate comprising:

depositing an electrically conductive etch mask polymer layer over a previously patterned substrate to a first thickness;

forming and patterning a resist layer over the conductive etch mask layer to a second thickness which is less than the first thickness, the patterning forming an opening in the resist layer having a minimum open dimension of less than or equal to 0.2 micron;

providing the substrate with patterned resist layer within a dual powered high density plasma etcher;

reactive ion etching within the plasma reactor through the electrically conductive layer through the resist opening using an oxygen containing plasma, the etching being conducted using ion energy of greater than 0 Volts and less than or equal to about 50 Volts and at a pressure of less than or equal to about 10 mTorr, and producing an opening in the conductive etch mask layer having a minimum open dimension of less than or equal to 0.2 micron;

etching into a substrate layer beneath the conductive etch mask layer through the conductive polymer layer opening to form a substrate feature having a minimum width of less than or equal to 0.2 micron;

removing the electrically conductive layer and the resist layer from the substrate; and the electrically conductive layer comprises an organic polymer selected from the group consisting of polymetallophthalocyanines, polymetalynes, polymeric metal complexes of tetrathiolatopyrazine, polymeric metal complexes of tetrathiolatobisdithiinopyrazine, and mixtures thereof.

20. A method of patterning a substrate comprising:

depositing an electrically conductive etch mask polymer layer over a previously patterned substrate to a first thickness;

forming and patterning a resist layer over the conductive etch mask layer to a second thickness which is less than the first thickness, the patterning forming an opening in the resist layer having a minimum open dimension of less than or equal to 0.2 micron;

providing the substrate with patterned resist layer within a dual powered high density plasma etcher;

reactive ion etching within the plasma reactor through the electrically conductive layer through the resist opening using an oxygen containing plasma, the etching being conducted using ion energy of greater than 0 Volts and less than or equal to about 50 Volts and at a pressure of less than or equal to about 10 mTorr, and producing an opening in the conductive etch mask layer having a minimum open dimension of less than or equal to 0.2 micron;

etching into a substrate layer beneath the conductive etch mask layer through the conductive polymer layer opening to form a substrate feature having a minimum width of less than or equal to 0.2 micron;

removing the electrically conductive layer and the resist layer from the substrate; and wherein the electrically conductive layer comprises a polymer which has a conductivity enhancing material added therein.

21. The method of claim 20 wherein the conductivity enhancing material is selected from the group consisting of tetrathiafulvalene, tetracyanoquinodimethane, carbon, silver, aluminum, transition metal halides, non-transition metal halides, and mixtures thereof.

22. A method of patterning a substrate comprising:

depositing an electrically conductive etch mask polymer layer over a previously patterned substrate to a first thickness;

forming and patterning a resist layer over the conductive etch mask layer to a second thickness which is less than the first thickness, the patterning forming an opening in the resist layer having a minimum open dimension of less than or equal to 0.2 micron;

providing the substrate with patterned resist layer within a dual powered high density plasma etcher;

reactive ion etching within the plasma reactor through the electrically conductive layer through the resist opening using an oxygen containing plasma, the etching being conducted using ion energy of greater than 0 Volts and less than or equal to about 50 Volts and at a pressure of less than or equal to about 10 mTorr, and producing an opening in the conductive etch mask layer having a minimum open dimension of less than or equal to 0.2 micron;

etching into a substrate layer beneath the conductive etch mask layer through the conductive polymer layer opening to form a substrate feature having a minimum width of less than or equal to 0.2 micron;

removing the electrically conductive layer and the resist layer from the substrate; and further comprising providing a masking layer intermediate the conductive polymer layer and the resist layer.

23. The method of claim 1 wherein the organic polymer comprises a polypyrrole.

24. The method of claim 1 wherein the organic polymer comprises a polyacetylene.

25. The method of claim 1 wherein the organic polymer comprises a polyphenylene.

26. The method of claim 1 wherein the organic polymer comprises a polyphenylenevinylene.

27. The method of claim 1 wherein the organic polymer comprises a polythiophene.

28. The method of claim 1 wherein the organic polymer comprises a copolymer of an N-substituted pyrrole.

29. The method of claim 1 wherein the organic polymer comprises a copolymer of an N-substituted thiophene.

30. The method of claim 1 wherein the organic polymer comprises a polyquinoline.

31. The method of claim 1 wherein the organic polymer comprises a polycarbazole.

32. The method of claim 1 wherein the organic polymer comprises a polyphenothiozone.

33. The method of claim 1 wherein the organic polymer comprises a polyphthalocyanine.

34. The method of claim 1 wherein the organic polymer comprises a polyphenlysulfide.

35. The method of claim 8 wherein the organic polymer comprises a polypyrrole.

36. The method of claim 8 wherein the organic polymer comprises a polyacetylene.

37. The method of claim 8 wherein the organic polymer comprises a polyphenylene.

38. The method of claim 8 wherein the organic polymer comprises a polyphenylenevinylene.

39. The method of claim 8 wherein the organic polymer comprises a polythiophene.

40. The method of claim 8 wherein the organic polymer comprises a copolymer of an N-substituted pyrrole.

41. The method of claim 8 wherein the organic polymer comprises a copolymer of an N-substituted thiophene.

42. The method of claim 8 wherein the organic polymer comprises a polyquinoline.

43. The method of claim 8 wherein the organic polymer comprises a polycarbazole.

44. The method of claim 8 wherein the organic polymer comprises a polyphenothiozone.

45. The method of claim 8 wherein the organic polymer comprises a polyphthalocyanine.

46. The method of claim 8 wherein the organic polymer comprises a polyphenlysulfide.

47. The method of claim 13 wherein the organic polymer comprises a polypyrrole.

48. The method of claim 13 wherein the organic polymer comprises a polyacetylene.

49. The method of claim 13 wherein the organic polymer comprises a polyphenylene.

50. The method of claim 13 wherein the organic polymer comprises a polyphenylenevinylene.

51. The method of claim 13 wherein the organic polymer comprises a polythiophene.

52. The method of claim 13 wherein the organic polymer comprises a copolymer of an N-substituted pyrrole.

53. The method of claim 13 wherein the organic polymer comprises a copolymer of an N-substituted thiophene.

54. The method of claim 13 wherein the organic polymer comprises a polyquinoline.

55. The method of claim 13 wherein the organic polymer comprises a polycarbazole.

56. The method of claim 13 wherein the organic polymer comprises a polyphenothiozone.

57. The method of claim 13 wherein the organic polymer comprises a polyphthalocyanine.

58. The method of claim 13 wherein the organic polymer comprises a polyphenlysulfide.

59. The method of claim 18 wherein the organic polymer comprises a polypyrrole.

60. The method of claim 18 wherein the organic polymer comprises a polyacetylene.

61. The method of claim 18 wherein the organic polymer comprises a polyphenylene.

62. The method of claim 18 wherein the organic polymer comprises a polyphenylenevinylene.

63. The method of claim 18 wherein the organic polymer comprises a polythiophene.

64. The method of claim 18 wherein the organic polymer comprises a copolymer of an N-substituted pyrrole.

65. The method of claim 18 wherein the organic polymer comprises a copolymer of an N-substituted thiophene.

66. The method of claim 18 wherein the organic polymer comprises a polyquinoline.

67. The method of claim 18 wherein the organic polymer comprises a polycarbazole.

68. The method of claim 18 wherein the organic polymer comprises a polyphenothiozone.

69. The method of claim 18 wherein the organic polymer comprises a polyphthalocyanine.

70. The method of claim 18 wherein the organic polymer comprises a polyphenlysulfide.

71. The method of claim 2 wherein the organic polymer comprises a polymetallophthalocyanine.

72. The method of claim 2 wherein the organic polymer comprises a polymetaline.

73. The method of claim 2 wherein the organic polymer comprises a polymeric metal complex of tetrathiolatopyrazine.

74. The method of claim 2 wherein the organic polymer comprises a polymeric metal complex of tetrathiolatobis-dithiinopyrazine.

75. The method of claim 9 wherein the organic polymer comprises a polymetallophthalocyanine.

76. The method of claim 9 wherein the organic polymer comprises a polymetaline.

77. The method of claim 9 wherein the organic polymer comprises a polymeric metal complex of tetrathiolatopyrazine.

78. The method of claim 9 wherein the organic polymer comprises a polymeric metal complex of tetrathiolatobis-dithiinopyrazine.

79. The method of claim 14 wherein the organic polymer comprises a polymetallophthalocyanine.

80. The method of claim 14 wherein the organic polymer comprises a polymetaline.

81. The method of claim 14 wherein the organic polymer comprises a polymeric metal complex of tetrathiolatopyrazine.

82. The method of claim 14 wherein the organic polymer comprises a polymeric metal complex of tetrathiolatobis-dithiinopyrazine.

83. The method of claim 19 wherein the organic polymer comprises a polymetallophthalocyanine.

84. The method of claim 19 wherein the organic polymer comprises a polymetaline.

85. The method of claim 19 wherein the organic polymer comprises a polymeric metal complex of tetrathiolatopyrazine.

86. The method of claim 19 wherein the organic polymer comprises a polymeric metal complex of tetrathiolatobis-dithiinopyrazine.

87. The method of claim 4 wherein the conductivity enhancing material comprises tetrathiafulvalene.

88. The method of claim 4 wherein the conductivity enhancing material comprises tetracyanoquinodimethane.

89. The method of claim 4 wherein the conductivity enhancing material comprises carbon.

90. The method of claim 4 wherein the conductivity enhancing material comprises silver.

91. The method of claim 4 wherein the conductivity enhancing material comprises aluminum.

92. The method of claim 4 wherein the conductivity enhancing material comprises a transition metal halide.

93. The method of claim 4 wherein the conductivity enhancing material comprises a non-transition metal halide.

94. The method of claim 11 wherein the conductivity enhancing material comprises tetrathiafulvalene.

95. The method of claim 11 wherein the conductivity enhancing material comprises tetracyanoquinodimethane.

96. The method of claim 11 wherein the conductivity enhancing material comprises carbon.

97. The method of claim 11 wherein the conductivity enhancing material comprises silver.

98. The method of claim 11 wherein the conductivity enhancing material comprises aluminum.

99. The method of claim 11 wherein the conductivity enhancing material comprises a transition metal halide.

100. The method of claim 11 wherein the conductivity enhancing material comprises a non-transition metal halide.

101. The method of claim 16 wherein the conductivity enhancing material comprises tetrathiafulvalene.

102. The method of claim 16 wherein the conductivity enhancing material comprises tetracyanoquinodimethane.

103. The method of claim 16 wherein the conductivity enhancing material comprises carbon.

104. The method of claim 16 wherein the conductivity enhancing material comprises silver.

105. The method of claim 16 wherein the conductivity enhancing material comprises aluminum.

106. The method of claim 16 wherein the conductivity enhancing material comprises a transition metal halide.

107. The method of claim 16 wherein the conductivity enhancing material comprises a non-transition metal halide.

108. The method of claim 21 wherein the conductivity enhancing material comprises tetrathiafulvalene.

109. The method of claim 21 wherein the conductivity enhancing material comprises tetracyanoquinodimethane.

110. The method of claim 21 wherein the conductivity enhancing material comprises carbon.

111. The method of claim 21 wherein the conductivity enhancing material comprises silver.

112. The method of claim 21 wherein the conductivity enhancing material comprises aluminum.

113. The method of claim 21 wherein the conductivity enhancing material comprises a transition metal halide.

114. The method of claim 21 wherein the conductivity enhancing material comprises a non-transition metal halide.

115. The method of claim 3 wherein the conductivity enhancing material comprises tetrathiafulvalene.

116. The method of claim 3 wherein the conductivity enhancing material comprises tetracyanoquinodimethane.

117. The method of claim 3 wherein the conductivity enhancing material comprises carbon.

118. The method of claim 3 wherein the conductivity enhancing material comprises silver.

119. The method of claim 3 wherein the conductivity enhancing material comprises aluminum.

120. The method of claim 3 wherein the conductivity enhancing material comprises a transition metal halide.

121. The method of claim 3 wherein the conductivity enhancing material comprises a non-transition metal halide.

122. The method of claim 10 wherein the conductivity enhancing material comprises tetrathiafulvalene.

123. The method of claim 10 wherein the conductivity enhancing material comprises tetracyanoquinodimethane.

124. The method of claim 10 wherein the conductivity enhancing material comprises carbon.

125. The method of claim 10 wherein the conductivity enhancing material comprises silver.

126. The method of claim 10 wherein the conductivity enhancing material comprises aluminum.

127. The method of claim 10 wherein the conductivity enhancing material comprises a transition metal halide.

128. The method of claim 10 wherein the conductivity enhancing material comprises a non-transition metal halide.

129. The method of claim 10 wherein the conductivity enhancing material comprises tetrathiafulvalene.

130. The method of claim 15 wherein the conductivity enhancing material comprises tetracyanoquinodimethane.

131. The method of claim 15 wherein the conductivity enhancing material comprises carbon.

132. The method of claim 15 wherein the conductivity enhancing material comprises silver.

133. The method of claim 15 wherein the conductivity enhancing material comprises aluminum.

134. The method of claim 15 wherein the conductivity enhancing material comprises a transition metal halide.

135. The method of claim 15 wherein the conductivity enhancing material comprises a non-transition metal halide.

\* \* \* \* \*

UNITED STATES PATENT AND TRADEMARK OFFICE
CERTIFICATE OF CORRECTION

PATENT NO : 6,087,270
DATED : July 11, 2000
INVENTOR(S) : Alan R. Reinberg et al.

It is certified that error appears in the above-identified patent and that said Letters Patent are hereby corrected as shown below:

Col. 4, line 33, please add the following after the period --Etching through layer 18a preferably comprises dry etching, such as plasma etching, and most preferably reactive ion etching within a dual-powered, high density plasma etcher. The dry etching preferably--

Col. 14, line 39
  replace "10"
  with --15--.

Signed and Sealed this

Seventeenth Day of April, 2001

Attest:

NICHOLAS P. GODICI

Attesting Officer        Acting Director of the United States Patent and Trademark Office